United States Patent [19]
Pederson

[11] Patent Number: 4,543,536
[45] Date of Patent: Sep. 24, 1985

[54] CHARGE AMPLIFIER WITH AUTOMATIC ZERO

[75] Inventor: Richard H. Pederson, Marshalltown, Iowa

[73] Assignee: Fisher Controls International, Inc., Marshalltown, Iowa

[21] Appl. No.: 592,053

[22] Filed: Mar. 22, 1984

[51] Int. Cl.[4] ............................................. H03F 3/68
[52] U.S. Cl. .................................... 330/85; 330/108; 330/107
[58] Field of Search ................. 330/85, 107, 108, 109, 330/294, 302; 328/167

[56] References Cited

U.S. PATENT DOCUMENTS 4,227,155  10/1980  Lerma ............................... 330/85 X

OTHER PUBLICATIONS

Cook, George and Elder, William F., "Feedback T Yields High Input Impedance", *Electronics*, Apr. 17, 1967, p. 91.

Primary Examiner—James B. Mullins
Assistant Examiner—Steven J. Mottola
Attorney, Agent, or Firm—Dale A. Kubly; Nicholas A. Camasto

[57] ABSTRACT

A charge amplifier includes an operational amplifier having first and second voltage dividers across its output connected to a capacitor and a resistor, respectively, in an R-C network returned to one input for magnifying the apparent value of the impedance of the capacitor and of the resistance of the resistor. Its output is also connected to an integrating network including another operational amplifier having its output supplied to a third voltage divider supplying signal to another input of the first operational amplifier. A pair of differentially coupled piezoelectric charge sources supply signal to the amplifier through filters and the second voltage divider has a portion shunted by a parallel connection of back-to-back diodes and another resistor for effectively attenuating response to low frequency signals.

13 Claims, 7 Drawing Figures

— PRIOR — ART —

CHARGE AMPLIFIER WITH AUTOMATIC ZERO

This invention relates generally to small signal amplifiers and, more particularly, to so-called charge amplifiers used in hostile environments, that is, in places where they are exposed to dust, temperature extremes, humidity and the like.

BACKGROUND OF THE INVENTION AND PRIOR ART

There is a great need for amplifiers of reasonable cost and high reliability that are capable of amplifying extremely small signals to usable levels. This is particularly true for flow measuring devices, such as vortex-shedding flowmeters, where piezoelectric elements may be used as sensors for measuring pressure changes in fluid flow. U.S. Pat. No. 4,350,047, issued Sept. 21, 1982 to Clarence F. Dewey, Jr. and David E. Wiklund and assigned to Fisher Controls Company, Inc., discloses a vortex-shedding flowmeter. The copending U.S. patent application, Ser. No. 534,979, filed Sept. 23, 1983, of David E. Wiklund, Brian J. Burlage and Gary A. Lenz, assigned to Fisher Controls International, Inc., discloses a piezoelectric pressure sensor element. The charge generated by each of the above-noted piezoelectric pressure sensors in that flowmeter embodiment is approximately $2 \times 10^{-12}$ coulombs at a flow rate of 4 Hz. Clearly, the need to amplify such a small, low frequency signal to a usable level places severe requirements on the charge amplifier design. This, of course, would usually result in an expensive unit or one that includes many design compromises.

Operational amplifiers which can perform this function are well known and are commonly available in a variety of configurations. Their cost, however, is commensurate with the stringency of their specifications. One very important characteristic of an operational amplifier intended for use with charge amplifiers is its "offset" voltage, which is essentially a low level signal inherent in the amplifier input. Unfortunately, any offset voltage is amplified along with input signals. Thus, if the amplifier is to be used with extremely low level input signals, the offset voltage of the amplifier becomes quite significant since it may have a magnitude near that of the input signal and may completely mask or obliterate the input signal. There is also an offset current which may flow in the inputs of the operational amplifier and which may be equally detrimental to its operation.

Another important factor in the design of charge amplifiers for flowmeter usage is that of the environment in which the flowmeters are situated. Flowmeters quite often are used in wet or humid environments and may even be completely exposed to the weather. Such environments are commonly considered to be "hostile" and very much unlike laboratory conditions which make for simpler designs. Such environmental conditions mandate that resistors of relatively low value be used. Typical resistors in charge amplifiers have values in excess of one megohm. Resistors of this magnitude will be very sensitive to foreign materials in the atmosphere or on the resistor surface, changes in temperature, the pressure and humidity of the environment and any deterioration in the resistor mounting structure, all of which will tend to increase leakage resistance and affect the resistor value.

The present invention solves the above shortcomings of the art with a circuit that is capable of using "off-the-shelf" type operational amplifiers, as opposed to those having specialized characteristics, such as extremely low offset voltages. Such off-the-shelf operational amplifiers may typically be purchased for less than one-tenth the cost of special operational amplifiers exhibiting extremely low offset voltage characteristics.

OBJECTS OF THE INVENTION

The principal object of this invention is to provide an improved low level signal amplifier.

Another object of this invention is to provide a low level signal amplifier capable of operating in hostile environments.

A still further object of this invention is to provide a charge amplifier which uses nominal off-the-shelf components and provides improved performance.

SUMMARY OF THE INVENTION

In accordance with the present invention, a high gain amplifier for amplifying extremely small signals in a hostile environment that precludes use of large value resistors, comprises an operational amplifier of nominal characteristics having an output terminal and two input terminals with a resistance-capacitance network connected between the output terminal and one of the input terminals, resistance magnification means magnifying the apparent value of the resistance in the resistance-capacitance network and feedback means for nullifying the effect of the resistance magnification means on the offset voltage of the operational amplifier.

BRIEF DESCRIPTION OF THE DRAWINGS

Other objects, advantages and features of the present invention will become apparent upon reading the following detailed description thereof in conjunction with the drawings in which.

DESCRIPTION OF THE PREFERRED EMBODIMENT

Figure 1:
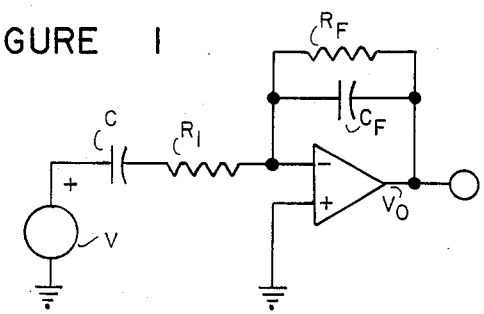
FIG. 1 represents a conventional operational amplifier of the prior art.

Referring to FIG. 1, there is shown a typical prior art operational amplifier coupled, for example, to a charge source such as a piezoelectric sensor. The amplifier has a negative input terminal, a positive input terminal, and an output terminal that is connected back to the negative input terminal through the parallel combination of a resistor $R_F$ and a capacitor $C_F$. The charge source, characterized in FIG. 1 by an equivalent output voltage V and a capacitance C, is coupled through a resistor $R_1$ to the negative input terminal of the operational amplifier.

Figure 2:
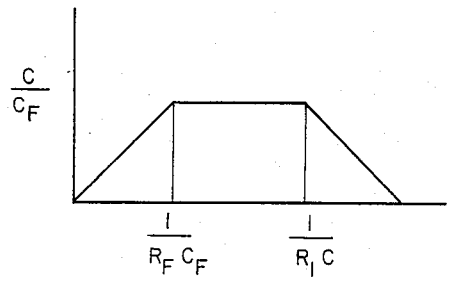
FIG. 2 represents a frequency response characteristic for the prior art amplifier.

It will be appreciated that the formula for charge is $Q = CV$. Consequently, a change in charge generated by the piezoelectric sensor, for example, may be considered as either a change in capacitance or a change in voltage with the other parameter held constant. In the analysis that follows the capacitance of the sensor is assumed to be constant and the voltage is the variable. The other approach can be used with equal facility and will lead to the same results. In either case, the response (or Bode plot) of the amplifier is illustrated in FIG. 2 with the frequency cutoffs given by $1/R_F C_F$ and $1/R_1 C$ and the gain by $V_o/V = C/C_F$.

As mentioned previously, a typical piezoelectric sensor may develop a charge of $2 \times 10^{-12}$ coulombs at a 4 Hz flow rate. In the equivalent circuit for the piezoelectric sensor, this is equal to capacitance C having a value of 200 picofarads and the piezoelectric sensor yielding a voltage V of approximately 10 millivolts. Assuming, for illustrative purposes, that the charge amplifier will only be used to match the sensor, thereby needing only unity gain at mid-band frequencies, capacitor $C_F$ must have a capacitance of 200 picofarads. For a response down to about 4 Hz it can be shown that resistor $R_F$ must have a resistance of 199 megohms. In a hostile environment a 199 megohm resistor is undesirable due to the environmental effects on leakage resistance pointed out above. Further, bias currents from the negative input terminal preclude use of this large a resistor.

Figure 3:
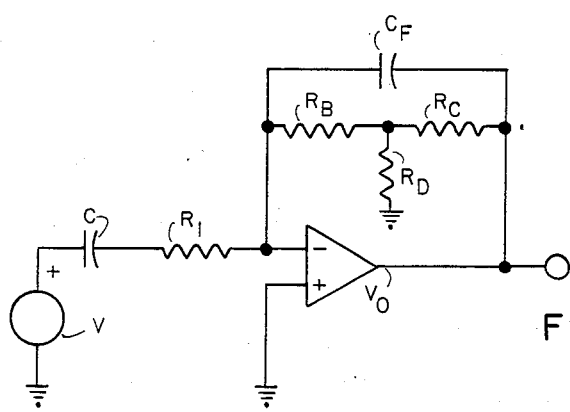
FIG. 3 represents a prior art operational amplifier having resistance magnification means.

The modified prior art circuit shown in FIG. 3 includes a resistance magnification arrangement which utilizes several resistors having a lower resistance and yet maintains a large apparent feedback resistance value. Here, resistor $R_F$ is replaced by a network including resistors $R_B$ and $R_C$ coupled in series between the output terminal of the operational amplifier and its negative input terminal and a resistor $R_D$ connecting the junction of resistors $R_B$ and $R_C$ to ground. If it is assumed that resistors $R_B$ and $R_C$ each have a resistance of one megohm, resistor $R_D$ must be approximately 5000 ohms to provide an equivalent feedback resistance of 199 megohms.

However, those skilled in the art will recognize that the amplifier of FIG. 3 has DC gain, and offset voltages at the negative input terminal will yield an offset voltage at the output terminal. There is also a small bias current that flows from the input terminal, which further exacerbates the offset voltage problem because it must flow through $R_F$. Thus, utilizing the circuit shown in FIG. 3 will permit the use of small resistors, but it also results in adding to the offset problem. In addition, if one wishes to increase the gain of the amplifier, the capacitance value of capacitor $C_F$ must be smaller, requiring larger resistance values for resistors $R_B$, $R_C$ and $R_D$ with the result that the aforementioned problems become still more severe. The output response for the amplifier of FIG. 3 is substantially the same as that illustrated in FIG. 2.

Figure 4:
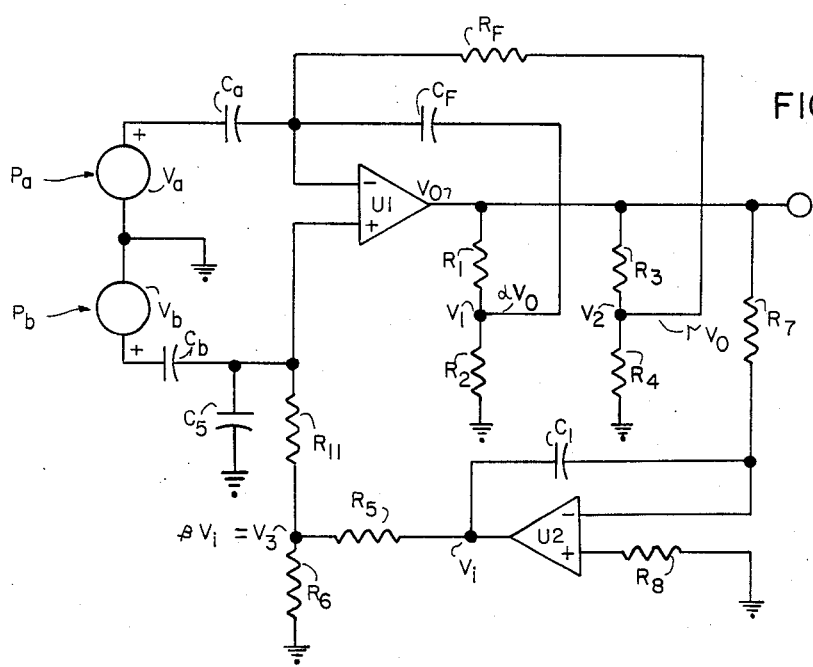
FIG. 4 represents an embodiment of the amplifier of the present invention.

In FIG. 4 a charge amplifier constructed in accordance with the present invention is shown. There, input signals to the charge amplifier are generated by two matched piezoelectric sensors $P_a$ and $P_b$ which produce electrical charges in response to a change in the force or pressure applied to the sensors according to the following relationship:

$$Q = CV = It = I/f \quad (1)$$

where Q is the charge developed by the sensor, C is the capacitance of the sensor, V is the voltage and I is the current developed by the sensor, t is time, and f is the frequency of the applied force. As before, input sensors $P_a$ and $P_b$ are characterized by respective voltage sources $V_a$ and $V_b$ connected in series with capacitors $C_a$ and $C_b$ respectively. The voltage sources have their negative terminals connected to ground and their positive terminals coupled respectively to the negative and positive input terminals of an operational amplifier U1 to provide twice the signal input to amplifier U1 and enhance the signal-to-noise ratio. The voltage at the output terminal $V_o$ of amplifier U1 is supplied to a first voltage divider consisting of a resistor $R_1$ and a resistor $R_2$ connected in series to ground and to a second voltage divider consisting of a resistor $R_3$ and a resistor $R_4$ connected in series to ground. The junction $V_1$ of resistors $R_1$ and $R_2$ is connected through a feedback capacitor $C_F$ to the negative input terminal of amplifier U1 while the junction $V_2$ of resistors $R_3$ and $R_4$ is connected through a feedback resistor $R_F$ to the negative input terminal of amplifier U1. The output terminal of amplifier U1 is also connected through a resistor $R_7$ to the negative input terminal of another operational amplifier U2 which has its positive input terminal connected to ground through a resistor $R_8$. The negative input terminal of amplifier U2 is connected through a capacitor $C_1$ to an output terminal $V_i$ of amplifier U2. Capacitor $C_1$ and resistor $R_7$ comprise an integrating network for the output of amplifier U1. The output terminal of amplifier U2 is connected to a third voltage divider consisting of a resistor $R_5$ coupled in series with a resistor $R_6$ to ground, the junction $V_3$ between resistors $R_5$ and $R_6$ being connected through a resistor $R_{11}$ to the positive input terminal of operational amplifier U1. A capacitor $C_5$ is connected from the positive input terminal of amplifier U1 to ground. The value of resistor $R_{11}$ is chosen to be equal to resistor $R_F$, and the value of capacitor $C_5$ is equal to capacitor $C_F$.

The first voltage divider (resistors $R_1$ and $R_2$) functions as an impedance magnification means for decreasing the apparent value of capacitor $C_F$ and the second voltage divider (resistors $R_3$ and $R_4$) functions as a resistance magnification mean for increasing the apparent value of resistor $R_F$. Similarly the third voltage divider (resistors $R_5$ and $R_6$) functions to increase or magnify the apparent time constant of the integrating network of resistor $R_7$ and capacitor $C_1$. As will be made clearer hereinafter, the three voltage dividers serve to allow independent adjustment of the damping coefficient (overshoot characteristic), the voltage gain and the lower cutoff, or "break", frequency for optimizing circuit performance.

The following analysis may be useful to understand the operation of the charge amplifier of the present invention. In this analysis, it will be understood that the voltages at $V_1$ and $V_2$ of the first and second voltage dividers bear the following relationship to the voltage $V_o$ at the output terminal of amplifier U1:

$$V_1 = \alpha V_o = \frac{R_2}{R_1 + R_2} V_o \quad (2)$$

$$V_2 = \gamma V_o = \frac{R_3}{R_3 + R_4} V_o \quad (3)$$

and that the voltage $V_3$ of the third voltage divider bears the following relationship to the voltage $V_i$ at the output terminal of amplifier U2:

$$V_3 = \beta V_i = \frac{R_5}{R_5 - R_6} V_i \tag{4}$$

Remembering that the resistance of resistor $R_F$ is magnified by the second voltage divider to, in effect, be in the neighborhood of 199 megohms, then essentially all of the current in the feedback circuit of amplifier U1 will flow through capacitor $C_F$ when amplifier U1 is operating in the mid-frequency range (e.g., 6 to 20 Hz for liquid applications) because the impedance of capacitor $C_F$ at such frequencies is lower. Because the AC gain of amplifier U1 is highest at such frequencies and the voltage at the negative input terminal of amplifier U1 remains essentially constant, the voltage $V_o$ at the output terminal of amplifier U1 must change to accomodate changes in the current through capacitor $C_F$ resulting from changes in the input current from the sensors. Thus, it can be seen from FIG. 4 that voltage $V_1$ is:

$$V_1 = \alpha V_o = \frac{I}{X_{CF}} = \frac{I}{2\pi f C_F} \tag{5}$$

But from (1), above, $I=fQ$, so that (5) becomes:

$$\alpha V_o = \frac{fQ}{2\pi f C_F} \tag{6}$$

or $$V_o = \frac{1}{\alpha}\left(\frac{Q}{2\pi C_F}\right) \tag{7}$$

From (7) it can be seen that the AC output voltage $V_o$ is directly proportional to the charge Q developed by the sensors during operation in the midfrequency range. And it can also be seen that the gain of amplifier U1 is inversely proportional to the value of feedback capacitor $C_F$ and $\alpha$, which is determined by the resistances of resistors $R_1$ and $R_2$ comprising the first voltage divider. Thus, the gain is independent of frequency at frequencies above the frequency at which resistor $R_F$ is rendered ineffective and can be adjusted by changing the values of $R_1$ and $R_2$ (i.e., $\alpha$) or capacitor $C_F$.

As the frequency of the force applied to the sensors decreases, the input current I developed by the sensors also decreases, and the impedance of capacitor $C_F$ increases, approaching the same magnitude as feedback resistor $R_F$. A point is reached (i.e., the lower break frequency) where some of the feedback current is diverted through resistor $R_F$. As the frequency continues to decrease, more current is diverted through resistor $R_F$ and the gain of amplifier U1 decreases until, at zero frequency, or DC, the gain is zero. Accordingly, it will be appreciated that the break frequency can be adjusted by varying the effective resistance of resistor $R_F$ through manipulation of the resistances of resistors $R_3$ and $R_4$ of the second voltage divider.

Of course, the positive input side of amplifier U1 matches the negative input side to provide differential action.

Using equations (2), (3) and (4), and assuming that sensors $P_a$ and $P_b$ are identical, such that capacitance $C_a$ of sensor $P_a$ and capacitance $C_b$ of sensor $P_b$ are equal to C (i.e., $C_a = C_b = C$), it can be shown that amplifier U1 has a frequency response given by:

$$\frac{V_o}{V_b - V_a} = \frac{C}{\alpha C_F} = \frac{\frac{\alpha}{\beta} R_F R_7 C_F C_1 s^2}{\frac{\alpha}{\beta} R_F R_7 C_F C_1 s^2 + \frac{\gamma}{\beta} R_7 C_1 s + 1} \tag{8}$$

For balanced sensors $V_a = -V_b$, and defining according to conventional nomenclature for a second order system, equation (8) has the format of a classical second order high pass network. Recognizing this and that $s = j2\pi f$, equation (8) can be rewritten:

$$\frac{V_o}{V_b} = K\left[\frac{s^2/\omega_o^2}{\frac{s^2}{\omega_o^2} + \frac{2\xi}{\omega_o}s + 1}\right] \tag{9}$$

= transfer function where:

$$K = \frac{2C}{\alpha C_F} \tag{10}$$

= gain in the pass band $$\omega_o = \left[\frac{1}{\frac{\alpha}{\beta} R_F R_7 C_F C_1}\right]^{\frac{1}{2}} \tag{11}$$

= lower break frequency in radians per sec $$\xi = \frac{\gamma}{2}\left[\frac{R_7 C_1}{\alpha \beta R_F C_F}\right]^{\frac{1}{2}} \tag{12}$$

= damping coefficient

In a typical design, the gain in the pass band, the damping coefficient and the lower frequency limit (break frequency) are known. Equations (11) and (12) can then be rewritten as follows if the substitution, $\omega_o = 2\pi f_o$, is made:

$$R_7 C_1 = 2\frac{\xi\beta}{\gamma\omega_o} = \frac{2\xi\beta}{2\pi\gamma f_o} = \frac{\xi\beta}{\pi\gamma f_o} \tag{13}$$

$$\gamma = 4 f_o \alpha R_F C_F \xi \pi \tag{14}$$

If it is assumed that $R_7$ is equal to $R_F$, the following results by combining equations (13) and (14):

$$R_7 = \frac{\xi\beta}{\pi C_1 f_o \gamma} = \frac{\gamma}{4\pi f_o \alpha \xi C_F} \tag{15}$$

and then solving for $\gamma$:

$$\gamma^2 = \frac{4\xi^2 \beta \alpha C_F}{C_1} \tag{16}$$

thus:

$$\gamma = 2\xi\left[\frac{\beta\alpha C_F}{C_1}\right]^{\frac{1}{2}} \tag{17}$$

or:

$$\gamma = 2\xi\left[\frac{2\beta C}{C_1 K}\right]^{\frac{1}{2}} \tag{18}$$

where $K = 2C/\alpha C_F$.

Accordingly, it will be appreciated that using the above series of equations, the selection of component values and circuit parameters for the charge amplifier is reduced to selecting the desired values for the gain (K), the damping ratio ($\xi$), the integrating capacitor ($C_1$), and the voltage divider ratio for the integrator ($\beta$). Thereafter, knowing the equivalent capacitance of the piezoelectric sensor (C), the voltage divider ratio $\gamma$ can be calculated using equation (18), and resistors $R_F$ and $R_7$ can then be calcualted by using equation (15). Similarly, the voltage divider ratio $\alpha$ can be calculated by using equation (10). Once these values are determined, the values for resistors $R_1$, $R_3$, and $R_5$ are selected by selecting $R_2$, and calculating $R_1$:

$$R_1 = R_2 - \alpha R_2/\alpha \tag{19}$$

selecting $R_4$, and calculating $R_3$:

$$R_3 = R_4 - \gamma R_4/\gamma \tag{20}$$

selecting $R_6$, and calculating $R_5$:

$$R_5 = R_6 - \beta R_6/\beta \tag{21}$$

As will be seen, in a steady state (DC condition) there can be no current flow into integrating capacitor $C_1$. If resistor $R_8$ is made equal to resistor $R_7$, the maximum value for voltage $V_o$ is the sum of any offset voltage for amplifier U2 plus the value of resistor $R_7$ times the differential bias current for amplifier U2, or:

$$V_{o(ss)} = V_{osU2} + R_7 \Delta I_{osU2} \tag{22}$$

Depending upon the particular amplifier used, the steady state output voltage will be in the millivolt range. The output voltage $V_o$ under steady state conditions, is held at this level by the control action of amplifier U2 adjusting voltage $V_3$ feeding into the positive input terminal of amplifier U1. Should output voltage $V_o$ drift positive and deliver current in excess of the bias current to the negative input terminal of amplifier U2, the integrator will ramp in the negative direction to reduce the voltage on the positive input terminal of amplifier U1. This voltage change will be seen to be in the proper direction to reduce the output voltage $V_o$ to its steady state value.

Figure 5:
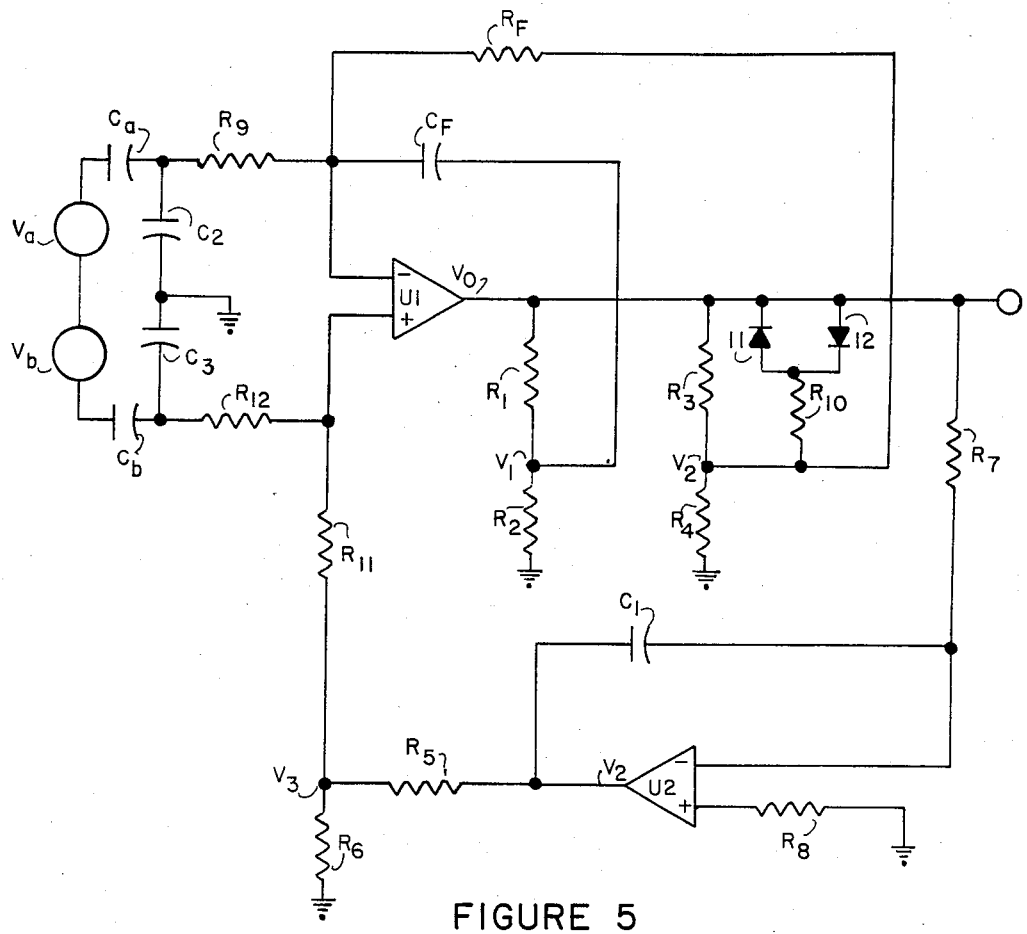
FIG. 5 represents a modified form of the amplifier of the present invention.

FIG. 5 discloses another embodiment for the charge amplifier of the present invention. Specifically, low pass filters consisting of a resistor $R_9$ and a capacitor $C_2$ and a resistor $R_{12}$ and a capacitor $C_3$ have been included. Resistor $R_9$ has the same value as resistor $R_{12}$, and capacitor $C_2$ has the same value as capacitor $C_3$. Resistor $R_9$ is connected between capacitor $C_a$ and the negative input terminal of operational amplifier U1 and resistor $R_{12}$ is connected between capacitor $C_b$ and the positive input terminal of amplifier U1. Capacitor $C_2$ is connected between the junction of capacitor $C_a$ and resistor $R_9$ and ground. Capacitor $C_3$ is connected between the junction of capacitor $C_b$ and resistor $R_{12}$ and ground.

An additional network comprising a pair of reverse connected diodes 11 and 12 connected in series with a resistor $R_{10}$ is connected across resistor $R_3$ in the second voltage divider network. At low signal levels, before diodes 11 and 12 conduct, the response for the charge amplifier is indicated by $$\frac{V_o}{V_a - V_b} = \frac{C}{\alpha C_F} = \frac{\frac{\alpha}{\beta} R_F R_7 C_F C_1 s^2}{\left(\frac{\alpha}{\beta} R_F R_7 C_F C_1 s^2 + \frac{\gamma}{\beta} R_7 C_1 s + 1\right)(R_9 C_2 s + 1)} \tag{23}$$

Insertion of the filter networks provides an additional pole ($R_9 C_2 s + 1$) so high frequency response can be reduced. The diodes and resistor $R_{10}$ are used to compensate for characteristics of a typical vortex flowmeter in which input signals increase as the flow (frequency) increases. In practice, the amplitude of the input signals increases as the square of the flow. This is equivalent to an increase of 40 db per decade. The additional filter elements resistor $R_9$, resistor $R_{12}$ and capacitors $C_2$ and $C_3$ compensate for approximately 20 db of that increse but the output voltage $V_o$ still tends to increase at 20 db per decade. The diodes conduct when the signal input amplitude reaches their conduction point ($\pm 0.5$ volt) and shunt resistor $R_{10}$ across resistor $R_3$ which changes the divider ratio, increasing the voltage $V_2$ which, in turn, increases damping for the amplifier. The effect of an increase in voltage $V_2$ with increased frequencies is to increase the charge amplifier damping ratio and effectively modify the charge amplifier frequency response to attenuate low frequencies.

Figure 6:
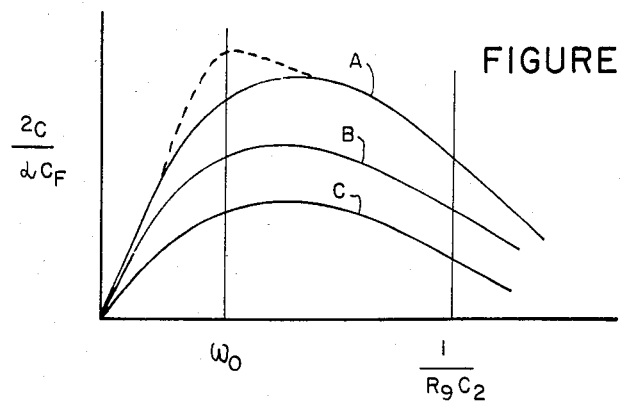
FIG. 6 represents the frequency characteristics of the amplifier of FIG. 5.

In FIG. 6 the frequency characteristic of a charge amplifier constructed in accordance with the circuit of FIG. 5 is illustrated. As will be seen the curve drops once the lower cutoff or break frequency is attained. The three solid line curves indicate the response for different input signal levels and illustrate the effect of diodes 11 and 12 in reducing the low frequency response of the amplifier. Curve A represents a low level signal of from 10 to 30 millivolts, curve B an intermediate level signal (30 mv to 0.5 V) and curve C a high level signal of from 0.5 V to 3 or 4 volts. The dashed line portion of curve A illustrates the effect of changing the damping coefficient of the charge amplifier. It should also be noted that the rate of decline of the response below the break frequency is substantially greater (40 db/decade) than the rate of decline (20 db/decade) illustrated in FIG. 2 for a conventional prior art charge amplifier.

Figure 7:
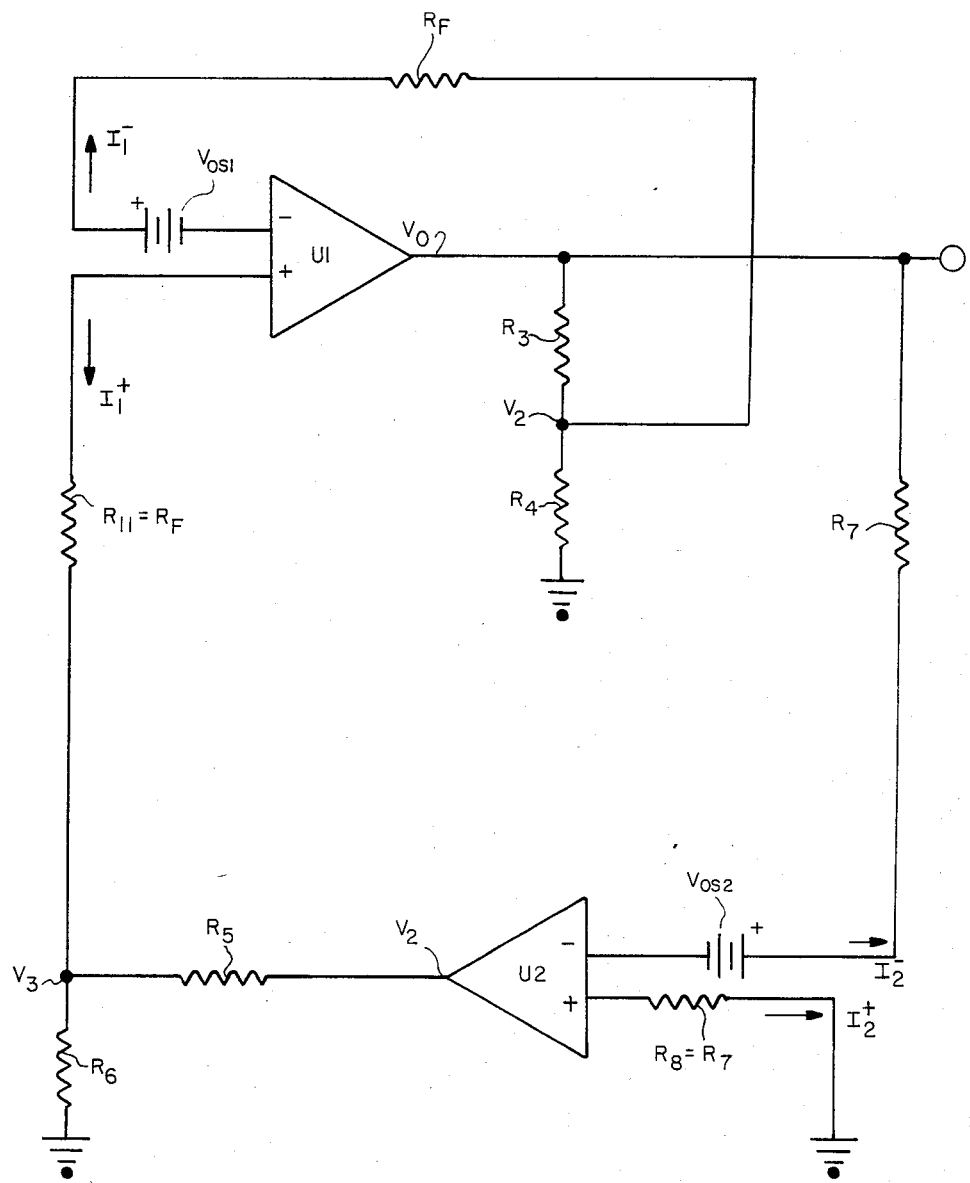
FIG. 7 is a "steady-state" equivalent of FIG. 4.

FIG. 7 represents the equivalent circuit for the "steady-state" condition of FIG. 4, which will be used to further describe the automatic zeroing of the offset. All capacitors, including those of the input sensors, have been eliminated since they do not conduct DC current. The amplifier U1 has an offset voltage $V_{os1}$, indicated by a battery. The only current that can flow through integrating resistor $R_7$ is bias current to amplifier U2, identified as $I_2^-$. The amplifier U2 has an offset voltage $V_{os2}$, also indicated by a battery. Voltage $V_o$ must adjust to balance offset voltage $V_{os2}$ under steady-state conditions. That is, it must change an amount sufficient to drive a bias current through $R_7$ to the negative input of amplifier U2.

Resistor $R_8$, connected between the positive input of amplifier U2 and ground, senses bias current $I_2^+$ on the positive input terminal. Since resistor $R_8$ is equal to resistor $R_7$, if $I_2^-$ and $I_2^+$ are equal, there is no net effect from the bias currents flowing through equal resistors. These currents are not equal, however, and their difference is the offset bias current. The offset bias current is always less than the bias current by a factor of 25 which greatly reduces interchangeability requirements for operational amplifiers used in the circuit.

Thus, in the steady state, operational amplifier U1 must adjust to precisely:

$$V_o = V_{os2} + R_7(I_2^- - I_2^+) \quad (24)$$

Where $I_2^- - I_2^+$ is the offset current.

If the output $V_o$ is too positive, making the current in $R_7$ greater than the required current $I_2^-$, the excess current appears as a positive input and causes the integrator output to go negative. The negative output signal is applied to the positive input terminal of operational amplifier U1 through the network of resistors $R_5$, $R_6$ and $R_{11}$. The output of amplifier U1 is reduced in response to the negative input signal to the correct value as indicated by the equations.

Consider now the characteristics of a typical operational amplifier, type LM 258A:

$$V_{os} = 1 \text{ millivolt (typical)}$$
$$= 3 \text{ millivolt (maximum)}$$
$$I_{offset} = 2 \text{ nanoamp (typical)}$$
$$= 15 \text{ nanoamp (maximum)}$$

If $R_7$ is one megohm, and these values are used in equation (24), the output of amplifier U1 is:

$$V_o = 0.001 + 10^6(2 \times 10^{-9})$$
$$= .005 \text{ volts (typical)}$$
$$V_o = .003 \times 10^6(15 \times 10^{-9})$$
$$= .018 \text{ volts (maximum)}$$

Thus $V_o$ should not exceed 18 millivolts from ground and is completely independent of the bias currents and the offset voltage of amplifier U1.

The amplifier of the invention thus includes feedback means for effectively sensing the offset of the operational amplifier, integrating it and "offsetting the offset" which automatically zeros the operational amplifier. As has been seen, this enables use of low value resistors making it suitable for use in hostile environments. It is expected that those skilled in the art will readily perceive numerous modifications in the illustrated embodiments of the invention. For example, capacitors $C_2$ and $C_3$ can be combined into one capacitor by eliminating the ground connection between them. If this single capacitor is sized to equal twice the value of $C_2$ and $C_3$ performance will be identical to that already described. Other changes will occur to those skilled in the art without departing from the true spirit and scope of the invention as defined in the claims.

What is claimed is:

1. A high gain amplifier for amplifying extremely small signals in a hostile environment that precludes use of large value resistors comprising:
    an operational amplifier of nominal characteristics and offset voltage having an output terminal and two input terminals;
    a resistance-capacitance network coupled between said output terminal and one of said input terminals;
    resistance magnification means for magnifying the apparent value of the resistance in said resistance-capacitance network; and
    feedback means for nullifying the effects of said resistance magnification means on said offset voltage of said operational amplifier.

2. The amplifier of claim 1 wherein said resistance magnification means include a voltage divider connected across the output terminal of said operational amplifier and being connected to the resistance in said resistance-capacitance network.

3. The amplifier of claim 2, further including;
    impedance magnification means for decreasing the apparent value of said capacitance in said resistance-capacitance network, both said magnification means enabling independent adjustment of the overshoot characteristic and cutoff frequency of said operational amplifier.

4. The amplifier of claim 3 wherein said impedance magnification means include another voltage divider connected across the output terminal of said operational amplifier and being connected to the capacitance in said resistance-capacitance network.

5. The amplifier of claim 4 wherein said feedback means include an integrating network having an input connected to the output terminal of said operational amplifier and an output coupled to the other of said input terminals of said operational amplifier.

6. The amplifier of claim 5 wherein said feedback means further include;
    another operational amplifier; and
    a further voltage divider coupled between the output of said integrating network and said other input terminal of said operational amplifier for amplifying the apparent time constant of said integrating network.

7. The amplifier of claim 6, further including;
    filter means coupled to the input terminals of said operational amplifier for reducing the high frequency response thereof by 20 db per decade.

8. The amplifier of claim 6, further including;
    diode means connected across a portion of said voltage divider for said resistance for shunting a portion thereof for given signal input levels.

9. A charge amplifier for amplifying extremely small signals in a hostile environment that precludes the use of large value resistors comprising;
    an operational amplifier of nominal characteristics and offset voltage having an output terminal and two input terminals;
    a resistance-capacitance network coupled between said output terminal and one of said input terminals;
    magnification means comprising a first voltage divider connected across the output terminal of said operational amplifier and connected to the resistance in said resistance-capacitance network for magnifying the apparent value of the resistance and a second voltage divider coupled across the output terminal of said operational amplifier and connected to the capacitance in said resistance-capacitance network for magnifying the impedance of the capacitance; and
    feedback means for nullifying the effects of said magnification means on said offset voltage of said operational amplifier, said feedback means including a third voltage divider connecting its output to the other of said input terminals of said operational amplifier, said magnification means enabling independent adjustment of the overshoot characteristics and cutoff frequency of said operational amplifier.

10. The amplifier of claim 9 wherein said feedback means include an integrating network, the time constant of which is magnified by said third voltage divider.

11. The amplifier of claim 10 wherein said feedback means includes a second operational amplifier connected to said third voltage divider.

12. The amplifier of claim 11, further including: filter means coupled to the input terminals of said operational amplifier for reducing the high frequency response of said operational amplifier by 20 db per decade.

13. The amplifier of claim 11, further including a pair of reverse connected diodes connected in parallel with a portion of said first voltage divider for shunting said portion for given input signal levels.

* * * * *